(12) United States Patent
Kono

(10) Patent No.: US 11,756,863 B2
(45) Date of Patent: Sep. 12, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hiroshi Kono, Hyogo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 36 days.

(21) Appl. No.: 17/193,765

(22) Filed: Mar. 5, 2021

(65) Prior Publication Data

US 2022/0093491 A1   Mar. 24, 2022

(30) Foreign Application Priority Data

Sep. 18, 2020   (JP) .................................. 2020-157962

(51) Int. Cl.
| | |
|---|---|
| H01L 23/482 | (2006.01) |
| H01L 29/78 | (2006.01) |
| H01L 29/16 | (2006.01) |

(52) U.S. Cl.
CPC ...... *H01L 23/4824* (2013.01); *H01L 23/4827* (2013.01); *H01L 29/1608* (2013.01); *H01L 29/7802* (2013.01)

(58) Field of Classification Search
CPC ............. H01L 23/4824; H01L 29/7802; H01L 29/1608; H01L 23/4827; H01L 29/7803; H01L 29/7804; H01L 29/861

USPC .............................. 257/77, 76; 438/105, 931
See application file for complete search history.

(56) References Cited

U.S. PATENT DOCUMENTS

| | | | |
|---|---|---|---|
| 2016/0379992 A1 | 12/2016 | Nagao et al. | |
| 2017/0271451 A1* | 9/2017 | Matshushita et al. | ....................... H01L 29/1095 |
| 2018/0331181 A1 | 11/2018 | Peters | |
| 2019/0115217 A1 | 4/2019 | Takaki et al. | |

FOREIGN PATENT DOCUMENTS

| | | |
|---|---|---|
| JP | 2015-159329 A | 9/2015 |
| JP | 6257554 B2 | 1/2018 |
| JP | 2018-198316 A | 12/2018 |
| JP | 2019-197920 A | 11/2019 |
| JP | 6610785 B2 | 11/2019 |
| WO | 2015/080162 A1 | 6/2015 |

\* cited by examiner

*Primary Examiner* — Thinh T Nguyen
(74) *Attorney, Agent, or Firm* — Kim & Stewart LLP

(57) ABSTRACT

According to an embodiment, provided is a semiconductor device includes a semiconductor layer; a first electrode; a second electrode; an electrode pad; a wiring layer electrically connected to the gate electrode; a first polycrystalline silicon layer electrically connected to the electrode pad and the wiring layer; and an insulating layer provided between the first polycrystalline silicon layer and the electrode pad and between the first polycrystalline silicon layer and the wiring layer and having a first opening and a second opening. The electrode pad and the first polycrystalline silicon layer are electrically connected via an inside of the first opening. The wiring layer and the first polycrystalline silicon layer are electrically connected via an inside of the second opening, A first opening area of the first opening is larger than a second opening area of the second opening.

8 Claims, 12 Drawing Sheets

SEMICONDUCTOR DEVICE

CROSS-REFERENCE TO RELATED APPLICATION

This application is based upon and claims the benefit of priority from Japanese Patent Application No. 2020-157962, filed on Sep. 18, 2020, the entire contents of which are incorporated herein by reference.

FIELD

Embodiments described herein relate generally to semiconductor devices.

BACKGROUND

In a power module in which a plurality of transistor chips are mounted on a substrate, a gate resistance component may be connected to a gate electrode pad of each transistor chip. By connecting the gate resistance component, for example, suppression of resonance between the transistor chips and uniform current flow in the power module are implemented.

In a case where the gate resistance component is connected outside the transistor chip, problems such as an increase in size of the power module and a loss of degree of the freedom in arrangement of the transistor chips in the power module occur. For this reason, in some cases, a gate resistor may be embedded in the transistor chip.

DETAILED DESCRIPTION

Figure 1:
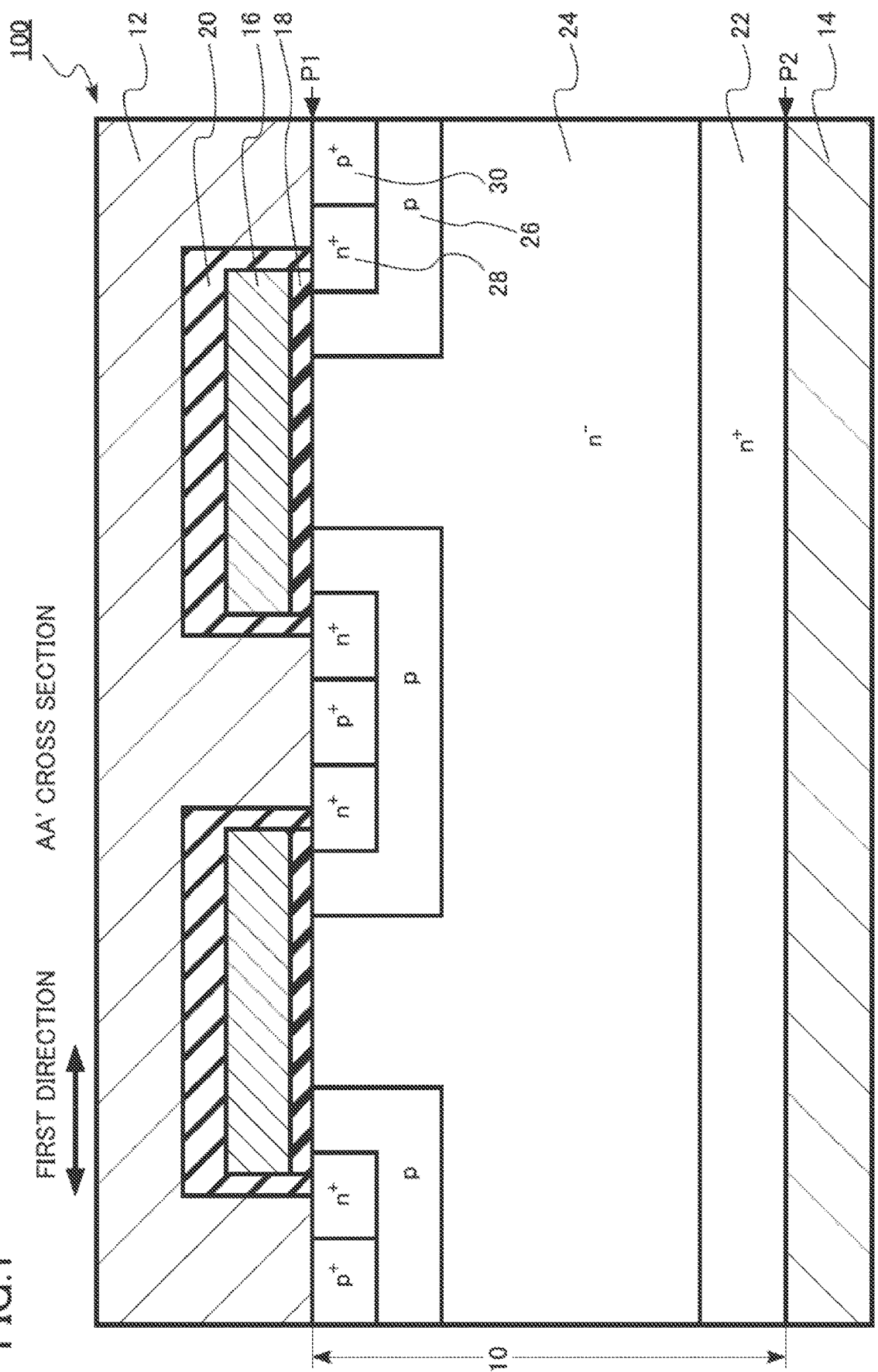
FIG. 1 is a schematic cross-sectional view of a portion of a semiconductor device according to a first embodiment.

According to an embodiment, there is provided semiconductor device including: a semiconductor layer having a first face and a second face facing the first face; a first electrode provided on a side of the first face of the semiconductor layer; a second electrode provided on a side of the second face of the semiconductor layer; a gate electrode provided on the side of the first face of the semiconductor layer; an electrode pad being provided on the side of the first face of the semiconductor layer; a wiring layer provided on the side of the first face of the semiconductor layer and electrically connected to the gate electrode; a first polycrystalline silicon layer provided on the side of the first face of the semiconductor layer, the first polycrystalline silicon layer electrically connected to the electrode pad and the wiring layer, and the first polycrystalline silicon layer extending in a first direction parallel to the first face; and an insulating layer provided between the first polycrystalline silicon layer and the electrode pad, the insulating layer provided between the first polycrystalline silicon layer and the wiring layer, and the insulating layer having at least one first opening and at least one second opening, wherein the electrode pad and the first polycrystalline silicon layer are electrically connected via an inside of the at least one first opening, the wiring layer and the first polycrystalline silicon layer are electrically connected via an inside of the at least one second opening, and a first opening area of the at least one first opening is larger than a second opening area of the at least one second opening.

Hereinafter, embodiments will be described with reference to the drawings. In addition, in the following description, the same or similar components and the like will be denoted by the same reference numerals, and the description of the components and the like once described will be omitted as appropriate.

First Embodiment

A semiconductor device according to a first embodiment includes: a semiconductor layer having a first face and a second face facing the first face; a first electrode provided on a side of the first face of the semiconductor layer; a second electrode provided on a side of the second face of the semiconductor layer; a gate electrode provided on the side of the first face of the semiconductor layer; an electrode pad being provided on the side of the first face of the semiconductor layer; a wiring layer provided on the side of the first face of the semiconductor layer and electrically connected to the gate electrode; a first polycrystalline silicon layer provided on the side of the first face of the semiconductor layer, the first polycrystalline silicon layer electrically connected to the electrode pad and the wiring layer, and the first polycrystalline silicon layer extending in a first direction parallel to the first face; and an insulating layer provided between the first polycrystalline silicon layer and the electrode pad, the insulating layer provided between the first polycrystalline silicon layer and the wiring layer, and the insulating layer having at least one first opening and at least one second opening. The electrode pad and the first polycrystalline silicon layer are electrically connected via an inside of the at least one first opening. The wiring layer and the first polycrystalline silicon layer are electrically connected via an inside of the at least one second opening. And a first opening area of the at least one first opening is larger than a second opening area of the at least one second opening.

The semiconductor device according to the first embodiment is a MOSFET 100. The MOSFET 100 is a double implantation MOSFET (DIMOSFET) in which a base region and a source region are formed by ion implantation. In addition, the MOSFET 100 is an n-channel MOSFET having electrons as carriers.

Figure 2:
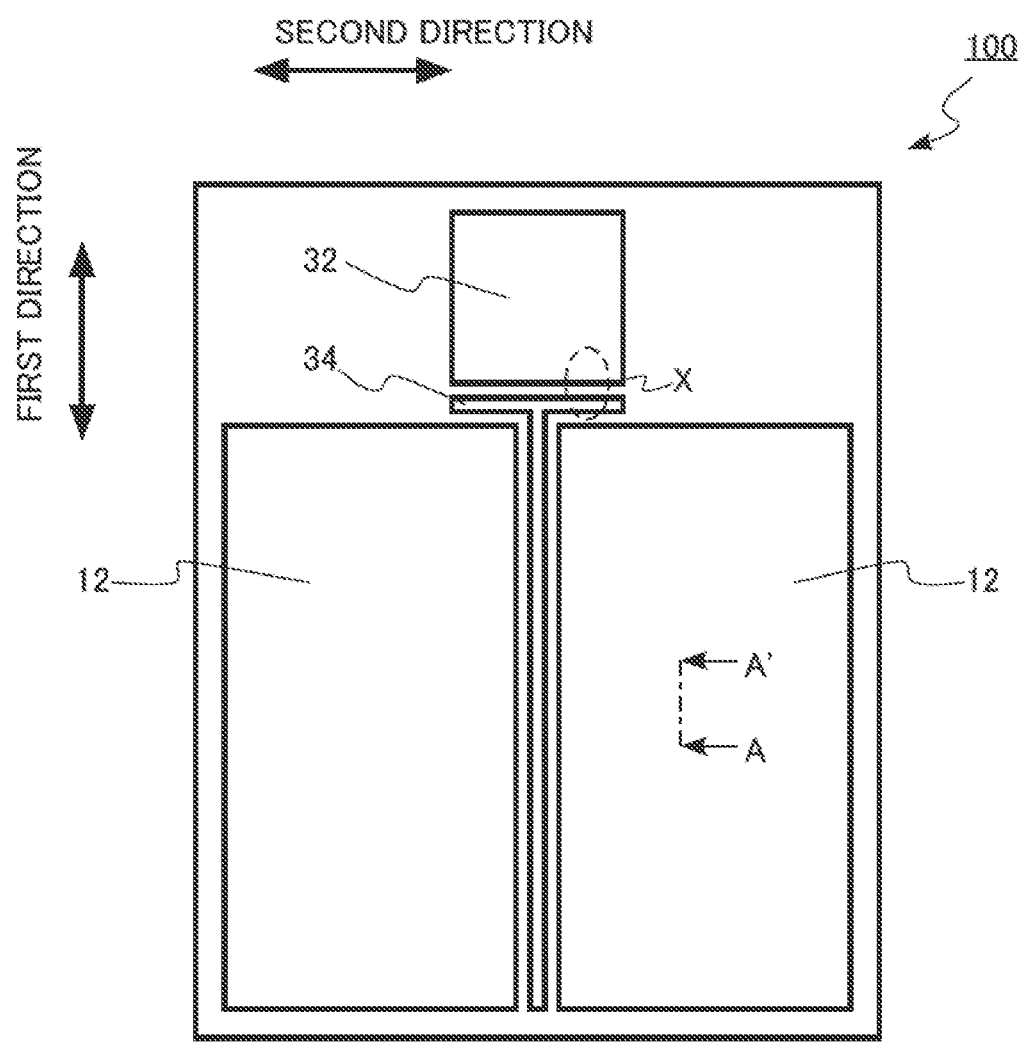
FIG. 2 is a schematic top view of the semiconductor device according to the first embodiment.

FIG. 1 is a schematic cross-sectional view of a portion of the semiconductor device according to the first embodiment. FIG. 2 is a schematic top view of the semiconductor device according to the first embodiment.

FIG. 1 is a cross-sectional view taken along line AA' of FIG. 2. FIG. 2 illustrates the overall layout on a first face P1 of FIG. 1.

As illustrated in FIG. 1, the MOSFET 100 includes a silicon carbide layer 10 (semiconductor layer), a source electrode 12 (first electrode), a drain electrode 14 (second electrode), a gate electrode 16, a gate insulating layer 18, and an interlayer insulating layer 20 (insulating layer).

The silicon carbide layer 10 includes an n$^+$-type drain region 22, an n$^-$-type drift region 24, a p-type body region 26, an n$^+$-type source region 28, and a p$^+$-type contact region 30.

The silicon carbide layer 10 is disposed between the source electrode 12 and the drain electrode 14. The silicon carbide layer 10 includes a first face ("P1" in FIG. 1) and a second face ("P2" in FIG. 1).

The second face P2 faces the first face P1. The second face P2 is parallel to the first face P1.

A first direction and a second direction are directions parallel to the first face P1. In addition, the second direction is a direction perpendicular to the first direction.

The source electrode 12 is provided on a side of the first face P1 of the silicon carbide layer 10. The source electrode 12 is provided on the first face P1 of the silicon carbide layer 10. The source electrode 12 is in contact with the first face P1.

The source electrode 12 is made of, for example, a metal. The source electrode 12 is electrically connected to the source region 28 and the contact region 30. The source electrode 12 is in contact with, for example, the source region 28 and the contact region 30.

The drain electrode 14 is disposed on a side of the second face P2 of the silicon carbide layer 10. The drain electrode 14 is provided on the second face P2 of the silicon carbide layer 10. The drain electrode 14 is in contact with the second face P2.

The drain electrode 14 is made of, for example, a metal or a metal semiconductor compound. The drain electrode 14 is electrically connected to the drain region 22. The drain electrode 14 is in contact with, for example, the drain region 22.

The gate electrode 16 is disposed on the side of the first face P1 of the silicon carbide layer 10. The gate electrode 16 extends in, for example, the second direction.

The gate electrode 16 is a conductive layer. The gate electrode 16 is made of, for example, polycrystalline silicon containing p-type impurities or n-type impurities.

The gate insulating layer 18 is disposed between the gate electrode 16 and the silicon carbide layer 10. The gate insulating layer 18 is, for example, a silicon oxide film.

The interlayer insulating layer 20 is provided on the gate electrode 16. The interlayer insulating layer 20 is provided between the gate electrode 16 and the source electrode 12. The interlayer insulating layer 20 electrically separates the gate electrode 16 and the source electrode 12. The interlayer insulating layer 20 is, for example, a silicon oxide film.

As illustrated in FIG. 2, the MOSFET 100 includes the source electrode 12 (first electrode), a gate electrode pad 32 (electrode pad), and a gate wiring layer 34 (wiring layer).

The gate electrode pad 32 is provided on the side of the first face P1 of the silicon carbide layer 10. A bonding wire can be connected on the gate electrode pad 32. The gate electrode pad 32 is connected to, for example, a gate driver circuit by using the bonding wire. A gate voltage is applied to the gate electrode pad 32 from the gate driver circuit via the bonding wire.

The gate electrode pad 32 is made of, for example, the same material as the source electrode 12. The gate electrode pad 32 is formed in, for example, the same layer as the source electrode 12. The gate electrode pad 32 is made of, for example, a metal.

The gate wiring layer 34 is provided on the side of the first face P1 of the silicon carbide layer 10. The gate wiring layer 34 is made of, for example, the same material as the source electrode 12 and the gate electrode pad 32. The gate electrode pad 32 is formed in, for example, the same layer as the source electrode 12 and the gate electrode pad 32. The gate electrode pad 32 is made of, for example, a metal.

A portion of the gate wiring layer 34 is provided adjacent to, for example, the gate electrode pad 32. A portion of the gate wiring layer 34 is provided along, for example, the gate electrode pad 32.

The gate wiring layer 34 is electrically connected to the gate electrode 16.

Figure 3:
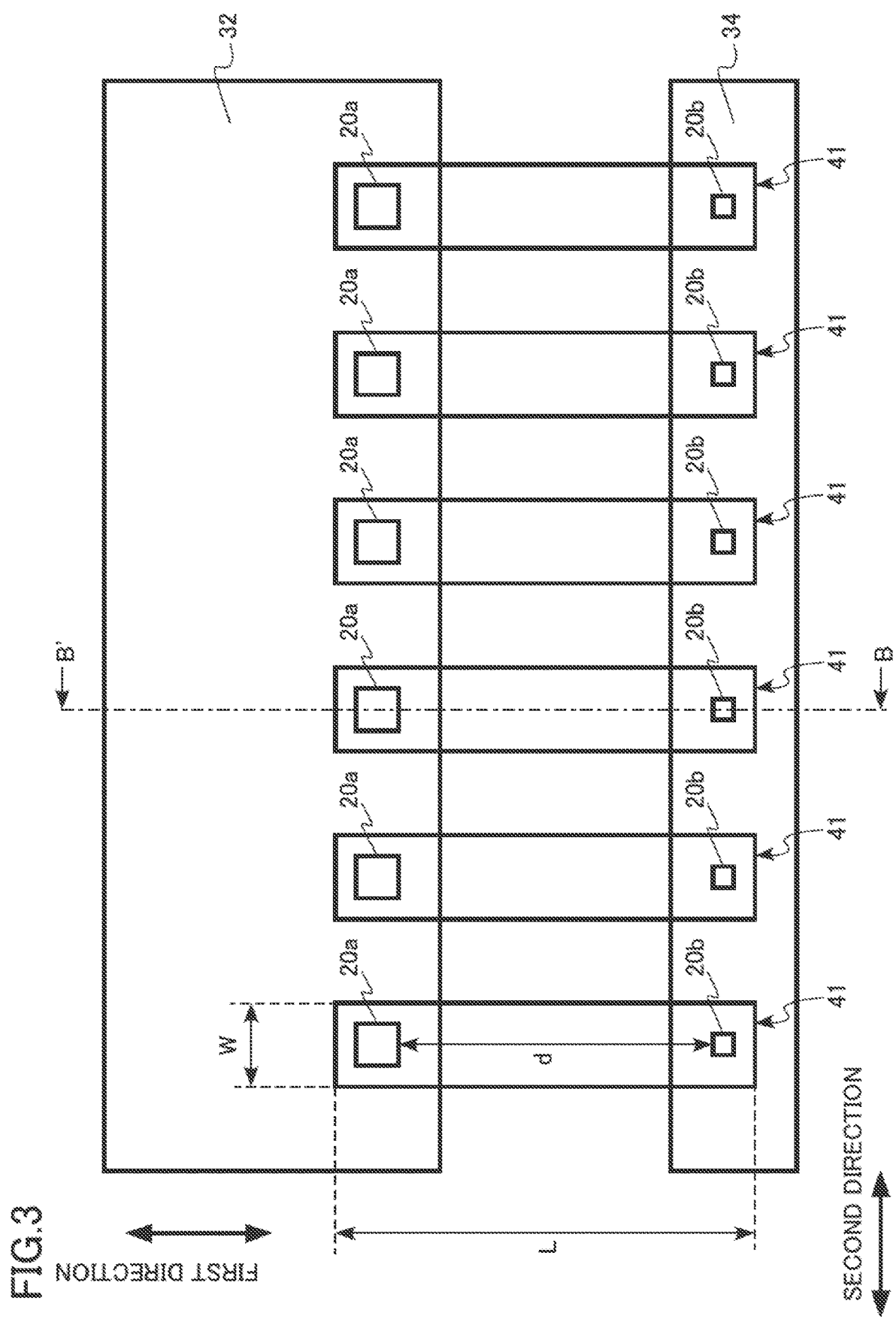
FIG. 3 is a schematic top view of a portion of the semiconductor device according to the first embodiment.

FIG. 3 is a schematic top view of a portion of the semiconductor device according to the first embodiment. FIG. 3 illustrates a pattern layout of a region X surrounded by a broken line in FIG. 2.

Figure 4:
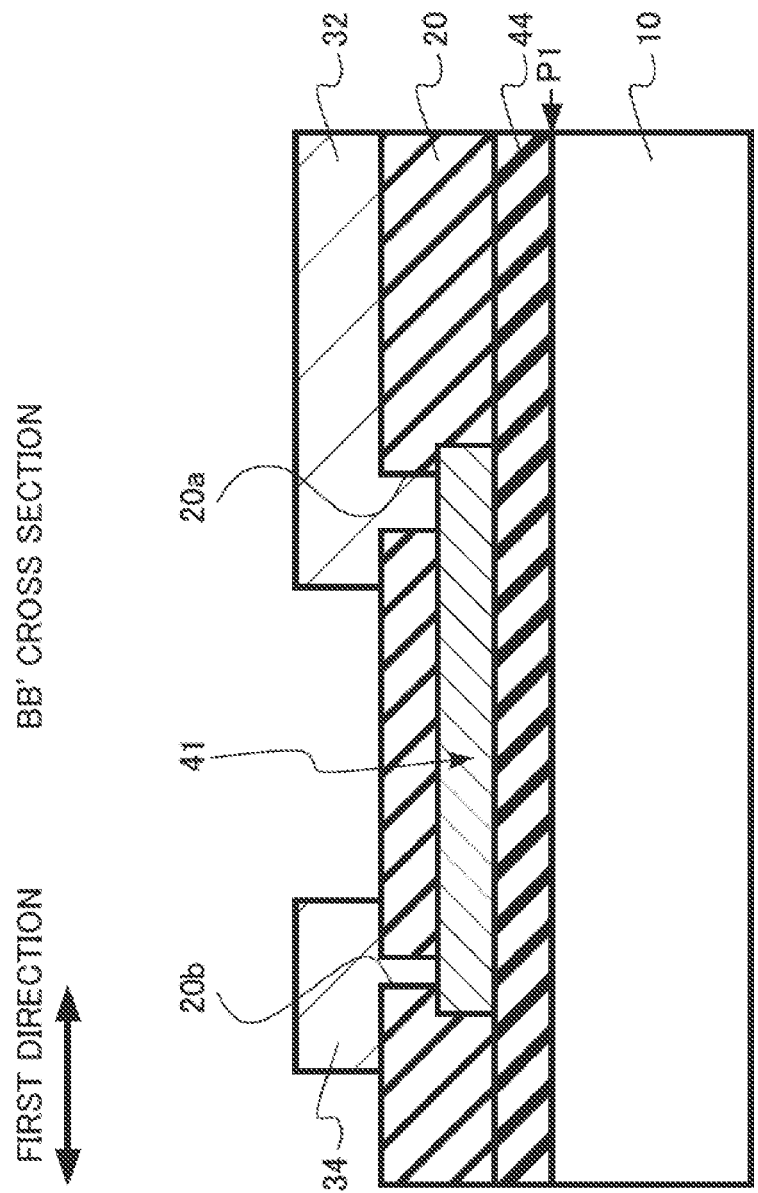
FIG. 4 is a schematic cross-sectional view of a portion of the semiconductor device according to the first embodiment.

FIG. 4 is a schematic cross-sectional view of a portion of the semiconductor device according to the first embodiment. FIG. 4 is a cross-sectional view taken along line BB' of FIG. 3.

As illustrated in FIGS. 1 to 4, the MOSFET 100 includes a silicon carbide layer 10 (semiconductor layer), a source electrode 12 (first electrode), an interlayer insulating layer 20 (insulating layer), a gate electrode pad 32 (electrode pad), a gate wiring layer 34 (wiring layer), a plurality of first polycrystalline silicon layers 41, and a field insulating layer 44. The interlayer insulating layer 20 has a first contact hole 20a (first opening) and a second contact hole 20b (second opening).

The field insulating layer 44 is provided on the silicon carbide layer 10. The field insulating layer 44 is, for example, a silicon oxide film.

The first polycrystalline silicon layer 41 is provided on the silicon carbide layer 10. The first polycrystalline silicon layer 41 is provided on the field insulating layer 44.

The first polycrystalline silicon layer 41 is electrically connected to the gate electrode pad 32 and the gate wiring layer 34. The gate electrode pad 32, the first polycrystalline silicon layer 41, the gate wiring layer 34, and the gate electrode 16 are connected in series. The first polycrystalline silicon layer 41 functions as a gate resistor embedded in the MOSFET 100.

The first polycrystalline silicon layer 41 extends in the first direction. A length (L in FIG. 3) of the first polycrystalline silicon layer 41 in the first direction is, for example, 200 μm or more and 500 μm or less. A width (W in FIG. 3) of the first polycrystalline silicon layer 41 in the second direction is, for example, 20 μm or more and 50 μm or less.

The first polycrystalline silicon layer 41 contains p-type impurities or n-type impurities. The p-type impurity is, for example, boron (B). The n-type impurity is, for example, phosphorus (P) or arsenic (As).

The first polycrystalline silicon layer 41 is made of, for example, the same material as the gate electrode 16. The first polycrystalline silicon layer 41 is formed in, for example, the same layer as the gate electrode 16.

The interlayer insulating layer 20 is provided between the first polycrystalline silicon layer 41 and the gate electrode pad 32. The interlayer insulating layer 20 is provided between the first polycrystalline silicon layer 41 and the gate wiring layer 34.

The interlayer insulating layer 20 has a first contact hole 20a and a second contact hole 20b. The first contact hole 20a and the second contact hole 20b have hole patterns provided in the interlayer insulating layer 20.

A first opening area of the first contact hole 20a is larger than a second opening area of the second contact hole 20b. The first opening area is, for example, twice or more and ten times or less of the second opening area.

The first opening area of the first contact hole 20a denotes an area of a region surrounded by a wall surface of the first contact hole 20a among the surfaces parallel to the first face P1. The first opening area of the first contact hole 20a is, for example, the area of a square illustrated the first contact hole 20a in FIG. 3.

Similarly, the second opening area of the second contact hole 20b denotes an area of a region surrounded by a wall surface of the second contact hole 20b among the surfaces parallel to the first face P1. The second opening area of the second contact hole 20b is, for example, the area of a square illustrated the second contact hole 20b in FIG. 3.

The gate electrode pad 32 and the first polycrystalline silicon layer 41 are electrically connected via the first contact hole 20a. For example, since the gate electrode pad 32 entering the first contact hole 20a is in contact with the first polycrystalline silicon layer 41 at the bottom of the first contact hole 20a, the gate electrode pad 32 and the first polycrystalline silicon layer 41 are electrically connected.

The gate wiring layer 34 and the first polycrystalline silicon layer 41 are electrically connected via the second contact hole 20b. For example, since the gate wiring layer 34 entering the second contact hole 20b is in contact with the first polycrystalline silicon layer 41 at the bottom of the second contact hole 20b, the gate wiring layer 34 and the first polycrystalline silicon layer 41 are electrically connected.

A distance (d in FIG. 3) between the first contact hole 20a and the second contact hole 20b is, for example, 100 μm or more and 300 μm or less.

Next, functions and effects of the semiconductor device according to the first embodiment will be described.

In a power module in which a plurality of transistor chips are mounted on a substrate, a gate resistance component may be connected to the gate electrode pad of each transistor chip. By connecting the gate resistance component, for example, suppression of resonance between the transistor chips and uniform current in the power module are implemented.

In a case where the gate resistance component is connected outside the transistor chip, problems such as an increase in size of the power module and a loss of the degree of freedom in arrangement of the transistor chips in the power module occur. For this reason, in some cases, the gate resistor may be embedded in the transistor chip.

However, the temperature rises due to the heat generated by the embedded gate resistor, and thus, there is a concern that a fluctuation in characteristics of the transistor occurs or the transistor is destructed.

For example, the resistance value of the gate resistor changes by the temperature rise due to the heat generation of the gate resistor, and thus, the fluctuation in characteristics of the transistor occurs. In addition, for example, by the temperature rise due to the heat generation of the gate resistor, the gate resistor is melted and cut, and thus, the transistor is destructed.

In the MOSFET 100 according to the first embodiment, the first opening area of the first contact hole 20a for connecting the gate electrode pad 32 and the first polycrystalline silicon layer 41 is larger than the second opening area of the second contact hole 20b for connecting the gate wiring layer 34 and the first polycrystalline silicon layer 41.

Since the first opening area of the first contact hole 20a is large, the heat generated in the first polycrystalline silicon layer 41 easily flows to the gate electrode pad 32.

The gate electrode pad 32 has a larger area than the gate wiring layer 34. For this reason, the gate electrode pad 32 has a higher heat dissipation efficiency than the gate wiring layer 34. In addition, in a state where the MOSFET 100 is mounted on the power module, for example, a bonding wire is connected to the gate electrode pad 32. For this reason, the gate electrode pad 32 can be expected to dissipate heat through the bonding wire. In addition, since it is necessary to perform bonding on the gate electrode pad 32, a protective film is not formed. Therefore, the heat dissipation efficiency is higher than that of the gate wiring layer 34 on which the protective film is formed.

The heat generated in the first polycrystalline silicon layer 41 more easily flows to the gate electrode pad 32 than the gate wiring layer 34, so that the temperature rise of the first polycrystalline silicon layer 41 is suppressed. Therefore, the fluctuation in characteristics and destruction of the MOSFET 100 are suppressed.

From the viewpoint of suppressing the temperature rise of the first polycrystalline silicon layer 41, the first opening area is preferably twice or more, more preferably four times or more of the second opening area.

As described above, according to the first embodiment, it is possible to provide a semiconductor device in which the temperature rise of the embedded gate resistor is suppressed.

Second Embodiment

A semiconductor device according to a second embodiment is different from the semiconductor device according to the first embodiment in that the number of at least one first opening is larger than the number of at least one second opening. Hereinafter, some descriptions of the contents overlapping with the first embodiment will be omitted.

The semiconductor device according to the second embodiment is a MOSFET 200.

Figure 5:
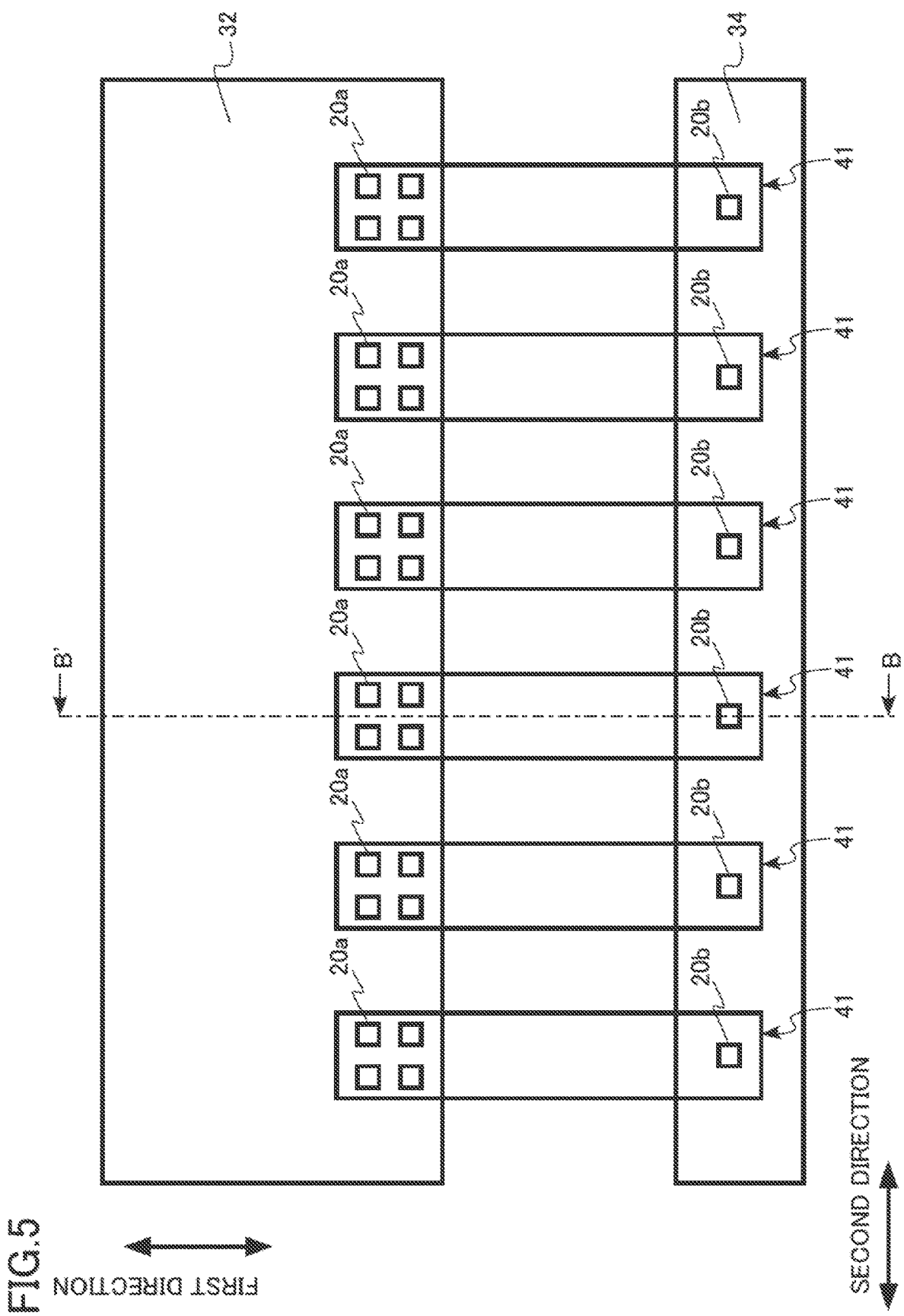
FIG. 5 is a schematic top view of a portion of a semiconductor device according to a second embodiment.

FIG. 5 is a schematic top view of a portion of the semiconductor device according to the second embodiment. FIG. 5 is a diagram corresponding to FIG. 3 of the first embodiment.

As illustrated in FIG. 5, in the MOSFET 200 according to the second embodiment, the number of first contact holes 20a is larger than the number of second contact holes 20b. The number of first contact holes 20a corresponding to one first polycrystalline silicon layer 41 is four, and the number of second contact holes 20b is one.

When a plurality of the first contact holes 20a are provided, a first opening area of the first contact holes 20a is the sum of the opening areas of the individual first contact holes 20a. Similarly, when a plurality of the second contact holes 20b are provided, a second opening area of the second contact holes 20b is the sum of the opening areas of the individual second contact holes 20b.

In the case of FIG. 5, the first opening area of the first contact hole 20a is four times of the second opening area of the second contact hole 20b.

As described above, according to the second embodiment, similarly to the first embodiment, it is possible to provide the semiconductor device in which a temperature rise of an embedded gate resistor is suppressed.

Third Embodiment

A semiconductor device according to a third embodiment is different from the semiconductor device according to the first embodiment in that the semiconductor device according to the third embodiment further includes a second polycrystalline silicon layer provided on a side of a first face of a semiconductor layer, the second polycrystalline silicon layer electrically connected to an electrode pad, the second polycrystalline silicon layer electrically separated from a wiring layer, and the second polycrystalline silicon layer extending in a first direction. Hereinafter, some descriptions of the contents overlapping with the first embodiment will be omitted.

The semiconductor device according to the third embodiment is a MOSFET 300.

Figure 6:
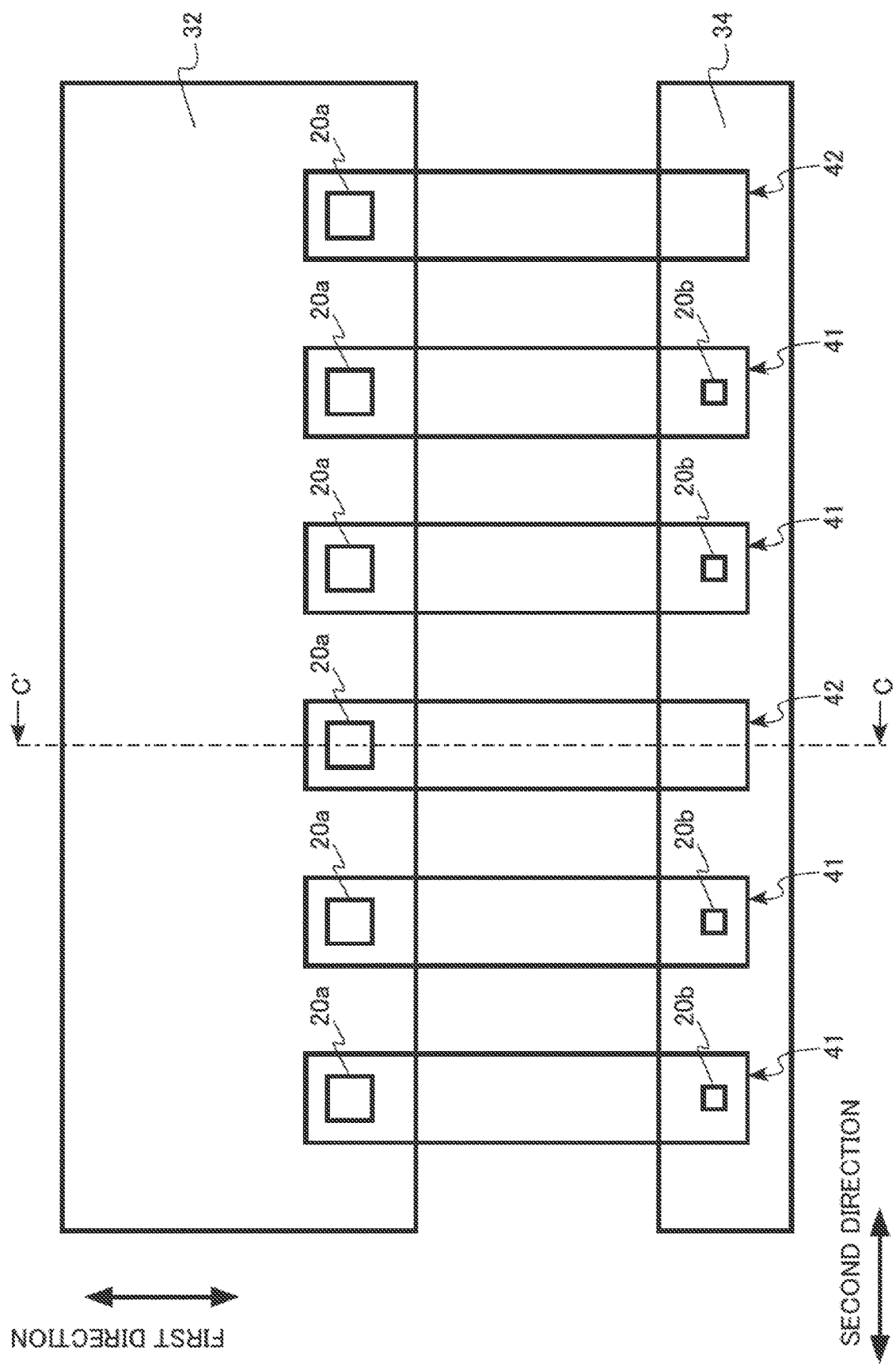
FIG. 6 is a schematic top view of a portion of a semiconductor device according to a third embodiment.

FIG. 6 is a schematic top view of a portion of the semiconductor device according to the third embodiment. FIG. 6 is a diagram corresponding to FIG. 3 of the first embodiment.

Figure 7:
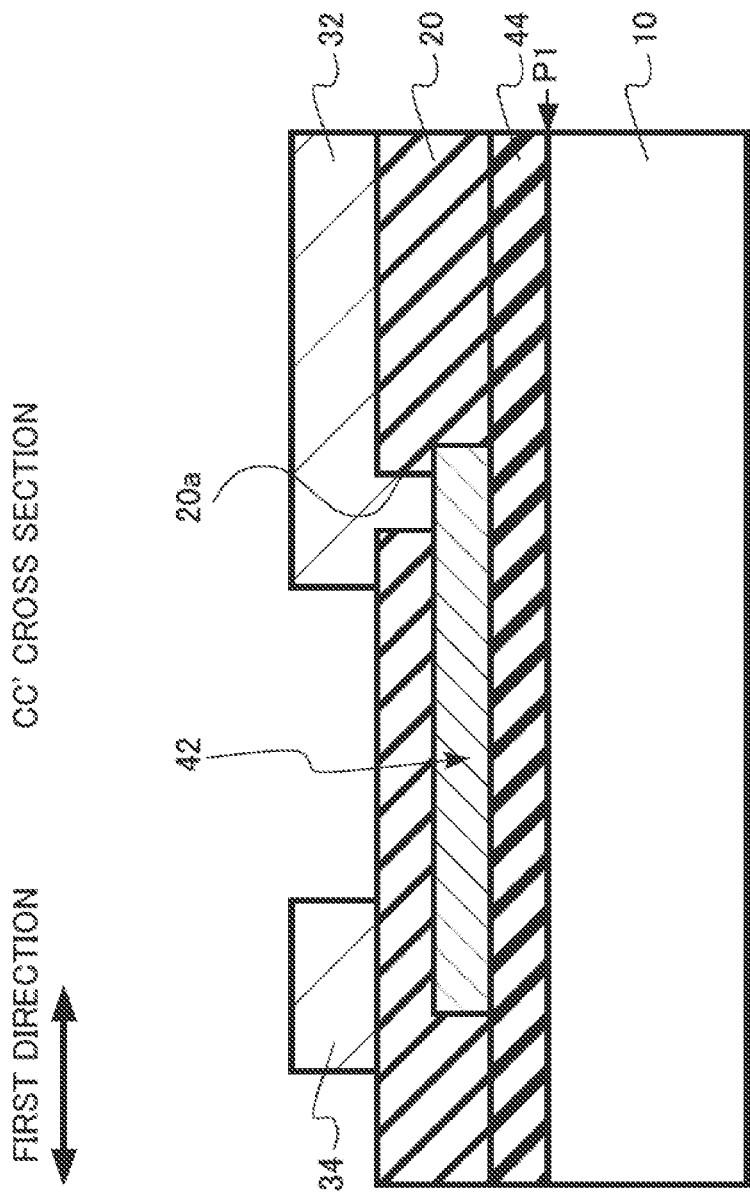
FIG. 7 is a schematic cross-sectional view of a portion of the semiconductor device according to the third embodiment.

FIG. 7 is a schematic cross-sectional view of a portion of the semiconductor device according to the third embodiment. FIG. 7 is a cross-sectional view taken along line CC' of FIG. 6.

As illustrated in FIGS. 6 and 7, the MOSFET 300 according to the third embodiment includes a second polycrystalline silicon layer 42 in addition to a first polycrystalline silicon layer 41. The second polycrystalline silicon layer 42 is provided on the side of a first face P1 of a silicon carbide layer 10. The second polycrystalline silicon layer 42 extends in the first direction.

The second polycrystalline silicon layer 42 is electrically connected to a gate electrode pad 32. The second polycrystalline silicon layer 42 is electrically separated from a gate wiring layer 34.

A contact hole for electrically connecting the gate wiring layer 34 and the second polycrystalline silicon layer 42 is not provided to an interlayer insulating layer 20.

Since the MOSFET 300 according to the third embodiment includes the second polycrystalline silicon layer 42 which is electrically separated from a gate wiring layer 34, it is possible to set a gate resistor to have a higher resistance value than that of the MOSFET 100 according to the first embodiment.

As described above, according to the third embodiment, similarly to the first embodiment, it is possible to provide the semiconductor device in which a temperature rise of the embedded gate resistor is suppressed.

Fourth Embodiment

A semiconductor device according to a fourth embodiment includes: a semiconductor layer having a first face and a second face facing the first face; a first electrode being provided on a side of the first face of the semiconductor layer; a second electrode being provided on a side of the second face of the semiconductor layer; a gate electrode being provided on the side of the first face of the semiconductor layer; an electrode pad being provided on the side of the first face of the semiconductor layer; a wiring layer being provided on the side of the first face of the semiconductor layer and being electrically connected to the gate electrode; a first polycrystalline silicon layer being provided on the side of the first face of the semiconductor layer, being electrically connected to the electrode pad and the wiring layer, extending in a first direction parallel to the first face, and including a first p-type region and a first n-type region; a second polycrystalline silicon layer being provided on the side of the first face of the semiconductor layer, being electrically connected to the electrode pad and the wiring layer, extending in the first direction, including a second n-type region and a second p-type region, and being separated from the first polycrystalline silicon layer; and an insulating layer being provided between the first polycrystalline silicon layer and the electrode pad, between the second polycrystalline silicon layer and the electrode pad, between the first polycrystalline silicon layer and the wiring layer, between the second polycrystalline silicon layer and the wiring layer, and including at least one first opening, at least one second opening, at least one third opening, and at least one fourth opening, wherein the electrode pad and the first p-type region are electrically connected via the at least one first opening, wherein the wiring layer and the first n-type region are electrically connected via the at least one second opening, wherein the electrode pad and the second n-type region are electrically connected via the at least one third opening, wherein the wiring layer and the second p-type region are electrically connected via the at least one fourth opening, wherein a first distance between a first junction plane of the first p-type region and the first n-type region and the at least one first opening is smaller than a second distance between the first junction plane and the at least one second opening, and wherein a third distance between a second junction plane of the second n-type region and the second p-type region and the at least one third opening is smaller than a fourth distance between the second junction plane and the at least one fourth opening. Hereinafter, in some cases, some descriptions of the contents overlapping with the first embodiment will be omitted.

The semiconductor device according to the fourth embodiment is a MOSFET 400. The MOSFET 400 has a transistor structure similar to the structure illustrated in FIG. 1 of the first embodiment.

Figure 8:
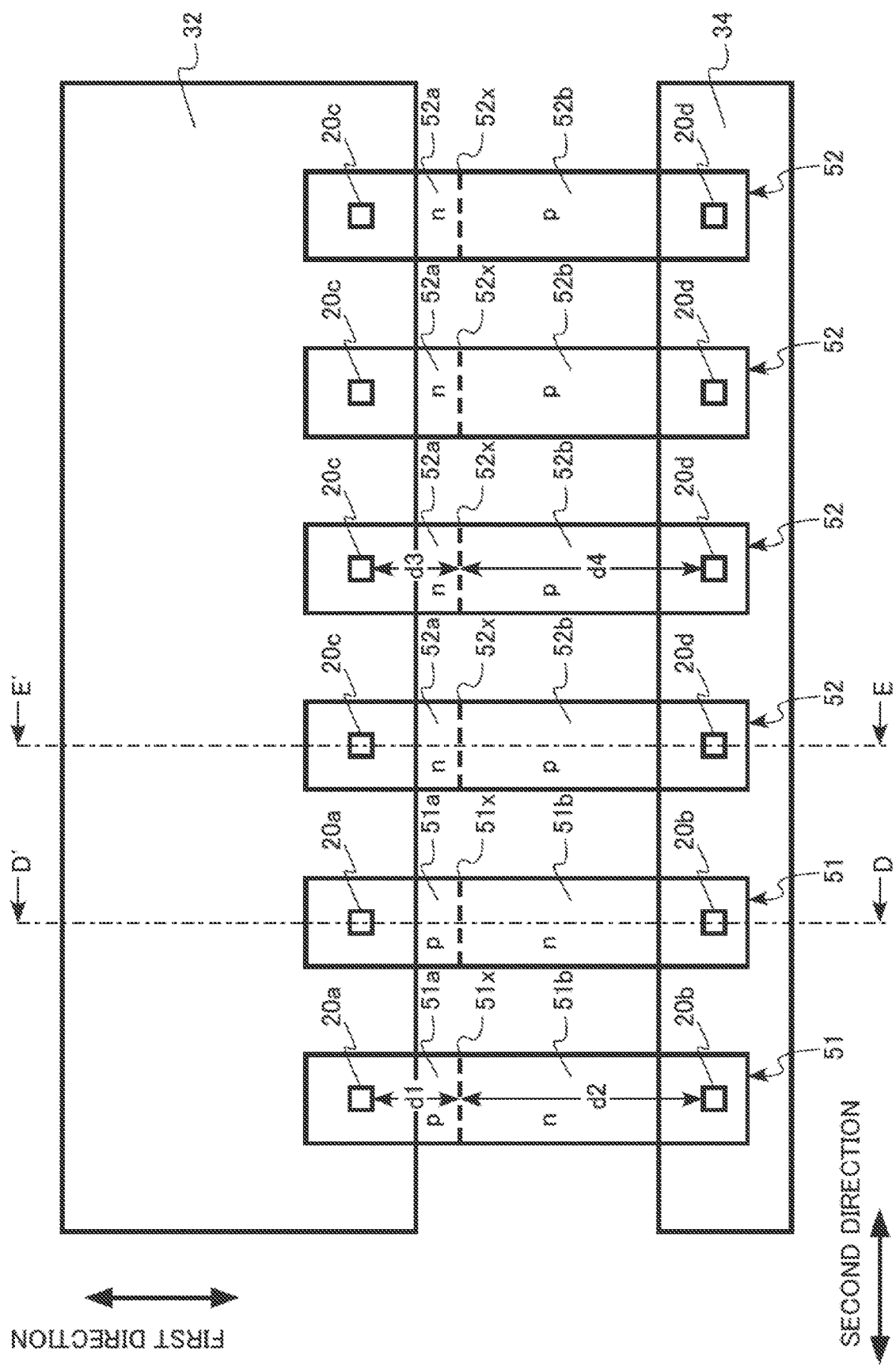
FIG. 8 is a schematic top view of a portion of a semiconductor device according to a fourth embodiment.

FIG. 8 is a schematic top view of a portion of the semiconductor device according to the fourth embodiment. FIG. 8 is a diagram corresponding to FIG. 3 of the first embodiment.

Figure 9:
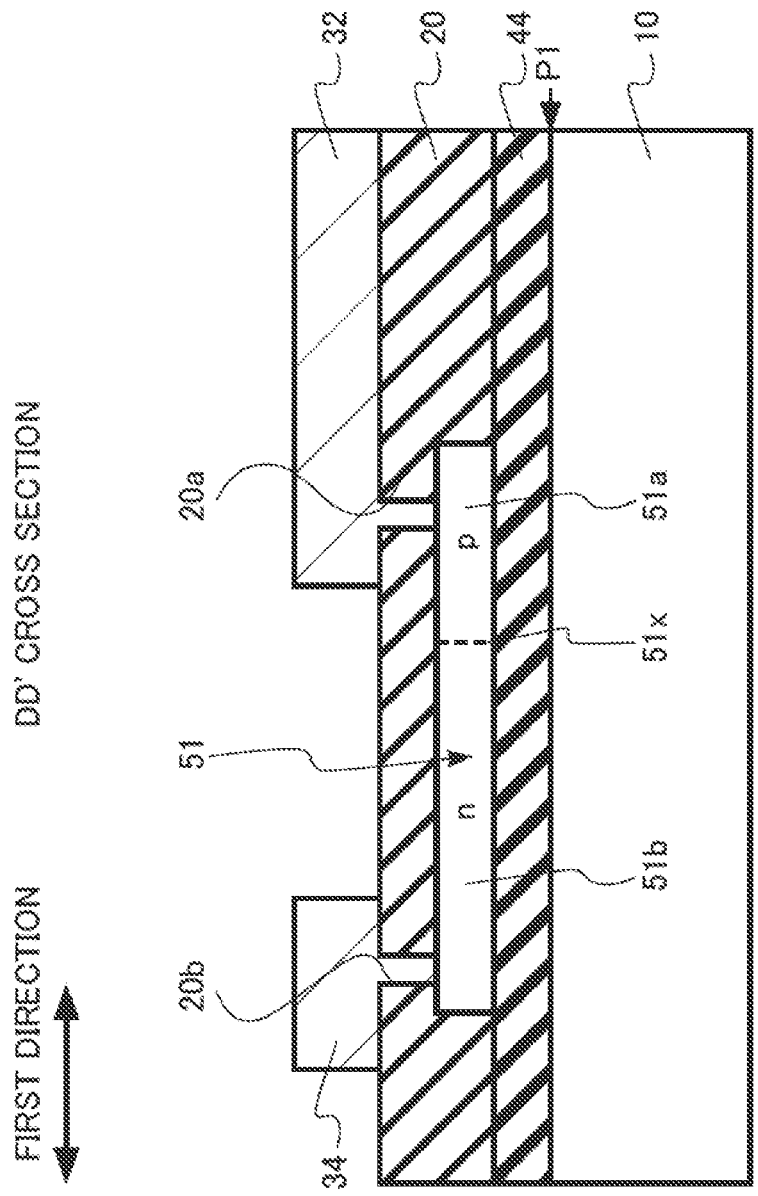
FIG. 9 is a schematic cross-sectional view of a portion of the semiconductor device according to the fourth embodiment.

FIG. 9 is a schematic cross-sectional view of a portion of the semiconductor device according to the fourth embodiment. FIG. 9 is a cross-sectional view taken along line DD' of FIG. 8.

Figure 10:
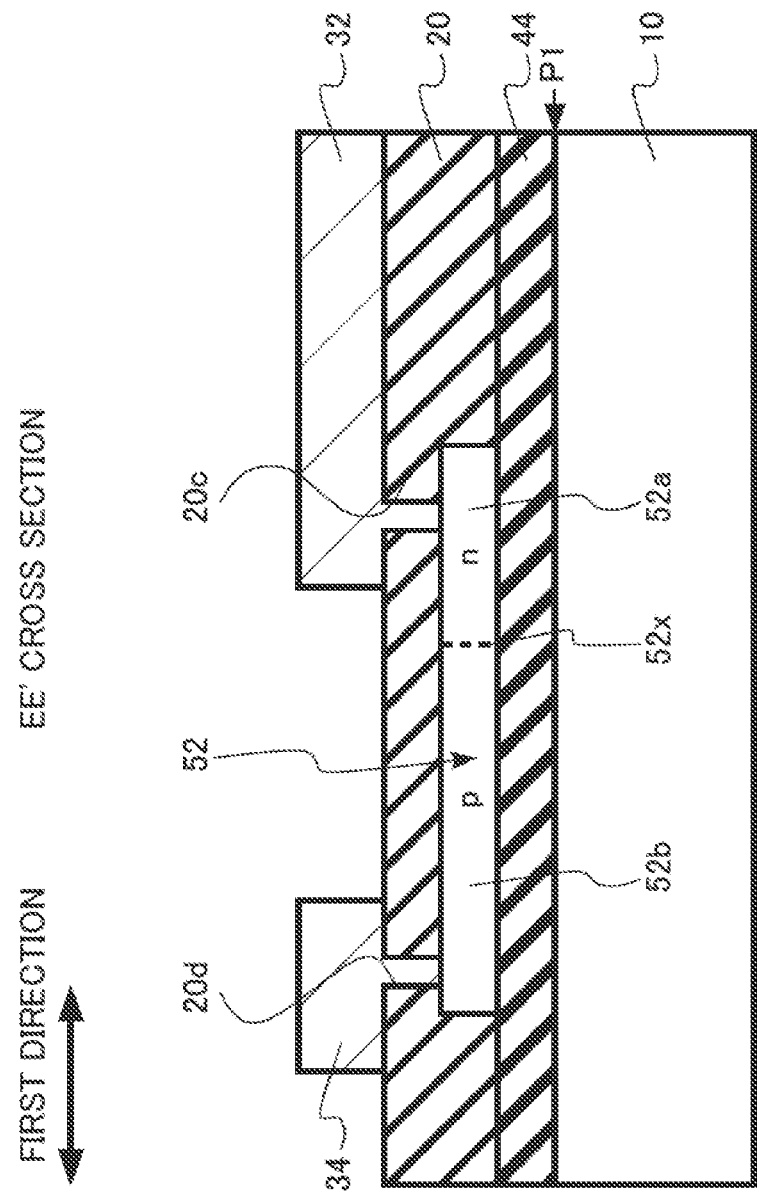
FIG. 10 is a schematic cross-sectional view of a portion of the semiconductor device according to the fourth embodiment.

FIG. 10 is a schematic cross-sectional view of a portion of the semiconductor device according to the fourth embodiment. FIG. 10 is a cross-sectional view taken along line EE' of FIG. 8.

As illustrated in FIGS. 8, 9 and 10, the MOSFET 400 includes a silicon carbide layer 10 (semiconductor layer), a source electrode 12 (first electrode), an interlayer insulating layer 20 (insulating layer), a gate electrode pad 32 (electrode pad), a gate wiring layer 34 (wiring layer), a plurality of first polycrystalline silicon layers 51, a plurality of second polycrystalline silicon layers 52, and a field insulating layer 44. The interlayer insulating layer 20 includes a first contact hole 20a (first opening), a second contact hole 20b (second opening), a third contact hole 20c (third opening), and a fourth contact hole 20d (fourth opening).

The field insulating layer 44 is provided on the silicon carbide layer 10. The field insulating layer 44 is, for example, a silicon oxide film.

The first polycrystalline silicon layer 51 and the second polycrystalline silicon layer 52 are provided on the silicon carbide layer 10. The first polycrystalline silicon layer 51 and the second polycrystalline silicon layer 52 are provided on the field insulating layer 44.

The first polycrystalline silicon layer 51 and the second polycrystalline silicon layer 52 are electrically connected to the gate electrode pad 32 and the gate wiring layer 34. The gate electrode pad 32, the first polycrystalline silicon layer 51, the gate wiring layer 34, and the gate electrode 16 are connected in series. The gate electrode pad 32, the second polycrystalline silicon layer 52, the gate wiring layer 34, and the gate electrode 16 are connected in series. The first polycrystalline silicon layer 51 and the second polycrystalline silicon layer 52 function as gate resistors embedded in the MOSFET 400.

The first polycrystalline silicon layer 51 extends in the first direction. A length of the first polycrystalline silicon layer 51 in the first direction is, for example, 200 μm or more and 500 μm or less. A width of the first polycrystalline silicon layer 51 in the second direction is, for example, 20 μm or more and 50 μm or less.

The first polycrystalline silicon layer 51 includes a first p-type region 51a and a first n-type region 51b. The first polycrystalline silicon layer 51 functions as a gate resistor with a pn diode.

The first p-type region 51a contains p-type impurities. The p-type impurity is, for example, boron (B).

The first n-type region 51b contains n-type impurities. The n-type impurity is, for example, phosphorus (P) or arsenic (As).

The second polycrystalline silicon layer 52 extends in the first direction. The second polycrystalline silicon layer 52 is separated from the first polycrystalline silicon layer 51. A length of the second polycrystalline silicon layer 52 in the first direction is, for example, 200 μm or more and 500 μm or less. A width of the second polycrystalline silicon layer 52 in the second direction is, for example, 20 μm or more and 50 μm or less.

The second polycrystalline silicon layer 52 includes a second n-type region 52a and a second p-type region 52b. The second polycrystalline silicon layer 52 functions as a gate resistor with a pn diode.

The second n-type region 52a contains n-type impurities. The n-type impurity is, for example, phosphorus (P) or arsenic (As).

The second p-type region 52b contains p-type impurities. The p-type impurity is, for example, boron (B).

The interlayer insulating layer 20 is provided between the first polycrystalline silicon layer 51 and the gate electrode pad 32 and between the second polycrystalline silicon layer 52 and the gate electrode pad 32. The interlayer insulating layer 20 is provided between the first polycrystalline silicon layer 51 and the gate wiring layer 34 and between the second polycrystalline silicon layer 52 and the gate wiring layer 34.

The interlayer insulating layer 20 has a first contact hole 20a, a second contact hole 20b, a third contact hole 20c, and a fourth contact hole 20d. The first contact hole 20a, the second contact hole 20b, the third contact hole 20c, and the fourth contact hole 20d are hole patterns provided in the interlayer insulating layer 20.

The gate electrode pad 32 and the first p-type region 51a are electrically connected via the first contact hole 20a. For example, since the gate electrode pad 32 entering the first contact hole 20a is in contact with the first p-type region 51a at the bottom of the first contact hole 20a, the gate electrode pad 32 and the first p-type region 51a are electrically connected.

The gate wiring layer 34 and the first n-type region 51b are electrically connected via the second contact hole 20b. For example, since the gate wiring layer 34 entering the second contact hole 20b is in contact with the first n-type region 51b at the bottom of the second contact hole 20b, the gate wiring layer 34 and the first n-type region 51b are electrically connected.

A distance between the first contact hole 20a and the second contact hole 20b is, for example, 100 μm or more and 300 μm or less.

A boundary between the first p-type region 51a and the first n-type region 51b is a first junction plane 51x. The first junction plane 51x is a pn junction.

A first distance (d1 in FIG. 8) between the first junction plane 51x and the first contact hole 20a is smaller than a second distance (d2 in FIG. 8) between the first junction plane 51x and the second contact hole 20b. The first distance d1 is, for example, one-half or less of the second distance d2.

The gate electrode pad 32 and the second n-type region 52a are electrically connected via the third contact hole 20c. For example, since the gate electrode pad 32 entering the third contact hole 20c is in contact with the second n-type region 52a at the bottom of the third contact hole 20c, the gate electrode pad 32 and the second n-type region 52a are electrically connected.

The gate wiring layer 34 and the second p-type region 52b are electrically connected via the fourth contact hole 20d. For example, since the gate wiring layer 34 entering the fourth contact hole 20d is in contact with the second p-type region 52b at the bottom of the fourth contact hole 20d, the gate wiring layer 34 and the second p-type region 52b are electrically connected.

A distance between the third contact hole 20c and the fourth contact hole 20d is, for example, 100 μm or more and 300 μm or less.

A boundary between the second n-type region 52a and the second p-type region 52b is a second junction plane 52x. The second junction plane 52x is a pn junction.

A third distance (d3 in FIG. 8) between the second junction plane 52x and the third contact hole 20c is smaller than a fourth distance (d4 in FIG. 8) between the second junction plane 52x and the fourth contact hole 20d. The third distance d3 is, for example, one-half or less of the fourth distance d4.

Next, functions and effects of the semiconductor device according to the first embodiment will be described.

Figure 11:
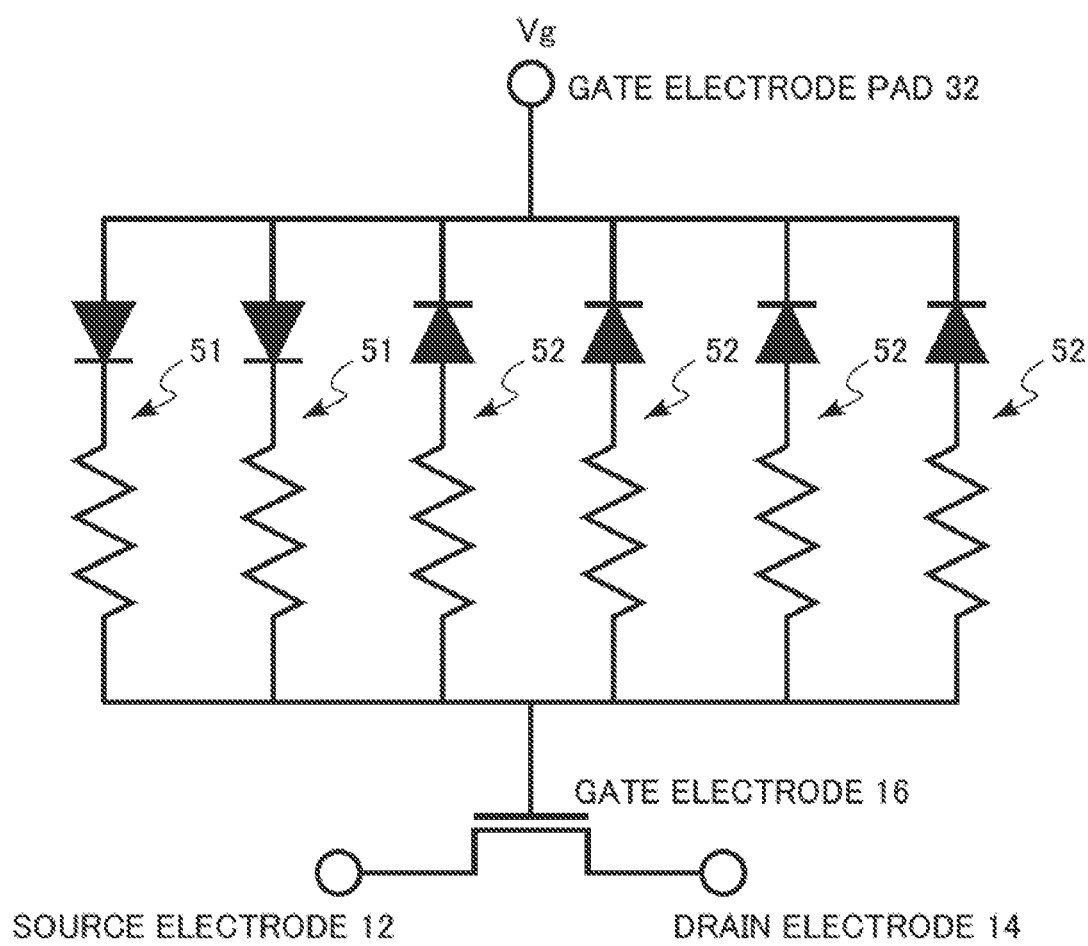
FIG. 11 is an explanatory diagram of functions and effects of the semiconductor device according to the fourth embodiment.

FIG. 11 is an explanatory diagram of functions and effects of the semiconductor device according to the fourth embodiment. FIG. 11 illustrates an equivalent circuit diagram including the gate resistors of the MOSFET 400.

In the MOSFET 400, different resistance values of the gate resistor can be applied at the time of the turn-on operation of the transistor and at the time of the turn-off operation of the transistor. In other words, an optimum resistance value of the gate resistor can be applied at the time of the turn-on operation of the transistor and at the time of the turn-off operation of the transistor.

For example, at the time of the turn-on operation in which the gate voltage Vg applied to the gate electrode pad 32 becomes a positive voltage with respect to the gate electrode 16, only the first polycrystalline silicon layer 51 functions as a gate resistor.

On the other hand, for example, at the time of the turn-off operation in which the gate voltage Vg applied to the gate electrode pad 32 becomes a negative voltage with respect to the gate electrode 16, only the second polycrystalline silicon layer 52 functions as a gate resistor.

As illustrated in FIG. 8, in the fourth embodiment, the number of first polycrystalline silicon layers 51 connected in parallel is two, and the number of second polycrystalline silicon layers 52 connected in parallel is four. For this reason, in a case where the resistance value of each of the first polycrystalline silicon layer 51 and the second polycrystalline silicon layer 52 is the same, the resistance value at the time of the turn-on operation of the transistor is larger than the resistance value at the time of the turn-off operation. For example, by increasing the resistance value at the time of the turn-on operation of the transistor, the resonance between the transistor chips can be suppressed. For example, a turn-off loss can be reduced by decreasing the resistance value at the time of the turn-off operation of the transistor.

In the MOSFET 400, the temperature of the first polycrystalline silicon layer 51 or the second polycrystalline silicon layer 52 rises due to the heat generated by the diode, and thus, there is a concern that a fluctuation in characteristics of the transistor occurs or the transistor is destructed.

In the MOSFET 400 according to the fourth embodiment, the first distance (d1 in FIG. 8) between the first junction plane 51x and the first contact hole 20a is smaller than the second distance (d2 in FIG. 8) between the first junction plane 51x and the second contact hole 20b. For this reason, the first contact hole 20a connected to the gate electrode pad 32 is provided at a location close to the pn junction of the diode.

Since the pn junction of the diode is close to the first contact hole 20a, the heat generated by the diode of the first polycrystalline silicon layer 51 easily flows to the gate electrode pad 32.

In addition, in the MOSFET 400 according to the fourth embodiment, the third distance (d3 in FIG. 8) between the second junction plane 52x and the third contact hole 20c is smaller than the fourth distance (d4 in FIG. 8) between the second junction plane 52x and the fourth contact hole 20d. For this reason, the third contact hole 20c connected to the gate electrode pad 32 is provided at a location close to the pn junction of the diode.

Since the pn junction of the diode is close to the third contact hole 20c, the heat generated by the diode of the second polycrystalline silicon layer 52 easily flows to the gate electrode pad 32.

The gate electrode pad 32 has a larger area than the gate wiring layer 34. For this reason, the gate electrode pad 32 has a higher heat dissipation efficiency than the gate wiring layer 34. In addition, in a state where the MOSFET 400 is mounted on the power module, for example, a bonding wire is connected to the gate electrode pad 32. The gate electrode pad 32 can be expected to dissipate heat through the bonding wire. In addition, a protective film is not formed on the gate electrode pad 32 for performing bonding. Therefore, the heat dissipation efficiency is higher than that of the gate wiring layer 34 on which the protective film is formed.

The heat generated by the diodes of the first polycrystalline silicon layer 51 and the second polycrystalline silicon layer 52 easily flows to the gate electrode pad 32, so that a temperature rise of the first polycrystalline silicon layer 51 and the second polycrystalline silicon layer 52 is suppressed. Therefore, the fluctuation in characteristics and the of the MOSFET 400 are suppressed.

From the viewpoint of suppressing the temperature rise of the first polycrystalline silicon layer 51, the first distance d1 is preferably one-half or less of the second distance d2, more preferably one-fourth or less of the second distance d2. In addition, from the viewpoint of suppressing the temperature rise of the second polycrystalline silicon layer 52, the third distance d3 is preferably one-half or less of the fourth distance d4, more preferably one-fourth or less of the fourth distance d4.

In addition, in FIG. 8, the case of changing the resistance value at the time of the turn-on operation of the transistor and the resistance value at the time of the turn-off operation of the transistor by changing the number of the first polycrystalline silicon layers 51 and the number of the second polycrystalline silicon layers 52 connected in parallel has been described as an example. However, for example, the resistance value at the time of the turn-on operation of the transistor and the resistance value at the time of the turn-off operation of the transistor may be allowed to be changed by changing the resistance value of each of the first polycrystalline silicon layer 51 and the second polycrystalline silicon layer 52.

In addition, the case where the resistance value at the time of the turn-on operation of the transistor is allowed to be larger than the resistance value at the time of the turn-off operation is described as an example, but the resistance value at the time of the turn-on operation of the transistor may be allowed to be smaller than the resistance value at the time of the turn-off operation.

As described above, according to the fourth embodiment, it is possible to provide a semiconductor device in which the temperature rise of the embedded gate resistor is suppressed.

Fifth Embodiment

A semiconductor device according to a fifth embodiment is different from the semiconductor device according to the fourth embodiment in that a first opening area of at least one first opening is larger than a second opening area of at least one second opening, and a third opening area of at least one third opening is larger than a fourth opening area of at least one fourth opening. Hereinafter, in some cases, some descriptions of the contents overlapping with the fourth embodiment will be omitted.

The semiconductor device according to the fifth embodiment is a MOSFET 500.

Figure 12:
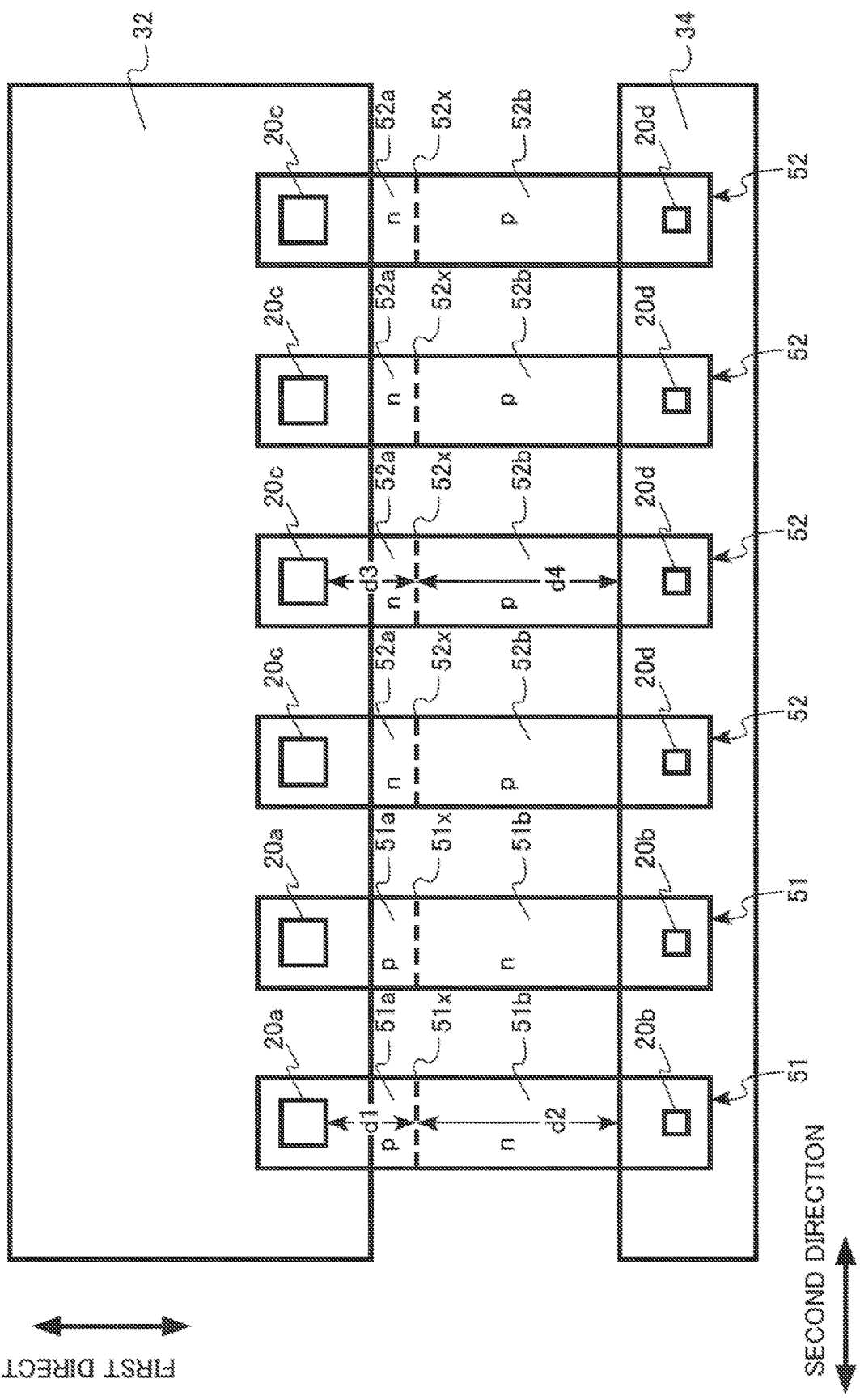
FIG. 12 is a schematic top view of a portion of a semiconductor device according to a fifth embodiment.

FIG. 12 is a schematic top view of a portion of the semiconductor device according to the fifth embodiment. FIG. 12 is a diagram corresponding to FIG. 8 of the fourth embodiment.

As illustrated in FIG. 12, in the MOSFET 500 according to the fifth embodiment, a first opening area of a first contact hole 20a is larger than a second opening area of a second contact hole 20b. Since the first opening area of the first contact hole 20a is large, the heat generated in a first polycrystalline silicon layer 51 easily flows to a gate electrode pad 32.

In addition, a third opening area of a third contact hole 20c is larger than a fourth opening area of a fourth contact hole 20d. Since the third opening area of the third contact hole 20c is large, the heat generated in a second polycrystalline silicon layer 52 easily flows to a gate electrode pad 32.

Therefore, the MOSFET 500 according to the fifth embodiment can further suppress a temperature rise of the first polycrystalline silicon layer 51 and the second polycrystalline silicon layer 52 as compared with the MOSFET 400 according to the fourth embodiment.

As described above, according to the fifth embodiment, it is possible to provide the semiconductor device in which a temperature rise of an embedded gate resistor is suppressed.

As described above, in the first to fifth embodiments, the n-channel MOSFETs are described as examples, but the embodiments can also be applied to p-channel MOSFETs.

In addition, in the first to fifth embodiments, the MOSFETs having a planar gate structure in which a gate electrode is provided on a first face of a semiconductor layer are described as examples, but the embodiments can also be applied to MOSFETs having a trench gate structure in which the gate electrode is provided in a trench formed in the semiconductor layer.

In addition, the embodiments can also be applied to an insulated gate bipolar transistor (IGBT).

In addition, in the first to fifth embodiments, the case where silicon carbide is used for the semiconductor layer is described as an example, but the semiconductor layer may be another semiconductor such as silicon.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer having a first face and a second face facing the first face;
   a first electrode provided on a side of the first face of the semiconductor layer;
   a second electrode provided on a side of the second face of the semiconductor layer;
   a gate electrode provided on the side of the first face of the semiconductor layer;
   an electrode pad being provided on the side of the first face of the semiconductor layer;
   a wiring layer provided on the side of the first face of the semiconductor layer and electrically connected to the gate electrode;
   a first polycrystalline silicon layer provided on the side of the first face of the semiconductor layer, the first polycrystalline silicon layer electrically connected to the electrode pad and the wiring layer, and the first polycrystalline silicon layer extending in a first direction parallel to the first face; and
   an insulating layer provided between the first polycrystalline silicon layer and the electrode pad, the insulating layer provided between the first polycrystalline silicon layer and the wiring layer, and the insulating layer having at least one first opening and at least one second opening,
   wherein the electrode pad and the first polycrystalline silicon layer are electrically connected via an inside of the at least one first opening,
   the wiring layer and the first polycrystalline silicon layer are electrically connected via an inside of the at least one second opening, and
   a first opening area of the at least one first opening is larger than a second opening area of the at least one second opening.

2. The semiconductor device according to claim 1, wherein a length of the first polycrystalline silicon layer in the first direction is 200 mm or more, and a width of the first polycrystalline silicon layer in a second direction parallel to the first face and perpendicular to the first direction is 50 mm or less.

3. The semiconductor device according to claim 1, wherein the first opening area is twice or more the second opening area.

4. The semiconductor device according to claim 1, wherein a number of the at least one first opening is larger than a number of the at least one second opening.

5. The semiconductor device according to claim 1, wherein the electrode pad is in contact with the first polycrystalline silicon layer, and the wiring layer is in contact with the first polycrystalline silicon layer.

6. The semiconductor device according to claim 1, further comprising a second polycrystalline silicon layer provided on the side of the first face of the semiconductor layer, the second polycrystalline silicon layer electrically connected to the electrode pad, the second polycrystalline silicon layer electrically separated from the wiring layer, and the second polycrystalline silicon layer extending in the first direction.

7. The semiconductor device according to claim 1, wherein the first polycrystalline silicon layer contains p-type impurities or n-type impurities.

8. The semiconductor device according to claim 1, wherein the semiconductor layer is a silicon carbide layer.

* * * * *